United States Patent
Tawa et al.

(10) Patent No.: US 8,145,061 B2
(45) Date of Patent: Mar. 27, 2012

(54) OPTICAL MODULE IMPLEMENTING A LIGHT-RECEIVING DEVICE AND A LIGHT-TRANSMITTING DEVICE WITHIN A COMMON HOUSING

(75) Inventors: Katsuhisa Tawa, Yokohama (JP); Manabu Shiozaki, Yokohama (JP); Hiromi Kurashima, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 569 days.

(21) Appl. No.: 12/352,771

(22) Filed: Jan. 13, 2009

(65) Prior Publication Data
US 2010/0178061 A1  Jul. 15, 2010

(51) Int. Cl.
*H04B 10/00* (2006.01)
(52) U.S. Cl. .................. 398/139; 398/135; 398/138
(58) Field of Classification Search ............ 398/41–42, 398/135–141
See application file for complete search history.

(56) References Cited

U.S. PATENT DOCUMENTS

| 7,093,988 | B2 | 8/2006 | Tsumori | |
| 2003/0231840 | A1* | 12/2003 | Okada et al. | 385/92 |
| 2004/0146304 | A1* | 7/2004 | Kuhara et al. | 398/138 |
| 2004/0240798 | A1* | 12/2004 | Baur | 385/88 |
| 2005/0213983 | A1* | 9/2005 | Shie et al. | 398/135 |
| 2006/0210280 | A1 | 9/2006 | Hayashi | |
| 2009/0080897 | A1* | 3/2009 | Shiozaki et al. | 398/139 |
| 2009/0129783 | A1* | 5/2009 | Ori et al. | 398/136 |

FOREIGN PATENT DOCUMENTS

| JP | S58-122473 | 8/1983 |
| JP | 03-003289 | 1/1991 |
| JP | 2001-326546 | 11/2001 |
| JP | 2003-282896 | 10/2003 |
| JP | 2005-045234 | 2/2005 |
| JP | 2005-203553 | 7/2005 |
| JP | 2005-294709 | 10/2005 |
| JP | 2006-041234 | 2/2006 |
| JP | 2006-253820 | 9/2006 |
| JP | 2007-081261 | 3/2007 |
| JP | 2007-096098 | 4/2007 |
| WO | WO-2005/091760 | 10/2005 |

* cited by examiner

*Primary Examiner* — Jessica Stultz
*Assistant Examiner* — Phillip Nguyen
(74) *Attorney, Agent, or Firm* — Venable LLP; Michael A. Sartori

(57) ABSTRACT

A bi-direction optical module with an arrangement to reduce the crosstalk noise is disclosed. The optical module comprises a laser diode (LD) driven by a differential signal and a photodiode (PD) on a single package. The PD is mounted on a position where the electrical potential measured from respective interconnections connected to the anode and to the cathode of the LD becomes the midpoint of the interconnections. The capacitances with respect the stem, where the LD and the PD are mounted thereon, viewed from the anode and the cathode of the LD becomes substantially equal to each other, or distances from the PD to respective interconnections are adjusted depending on the length of the interconnection facing the PD. Twisting the interconnections to the LD may be effective to reduce the crosstalk.

11 Claims, 11 Drawing Sheets

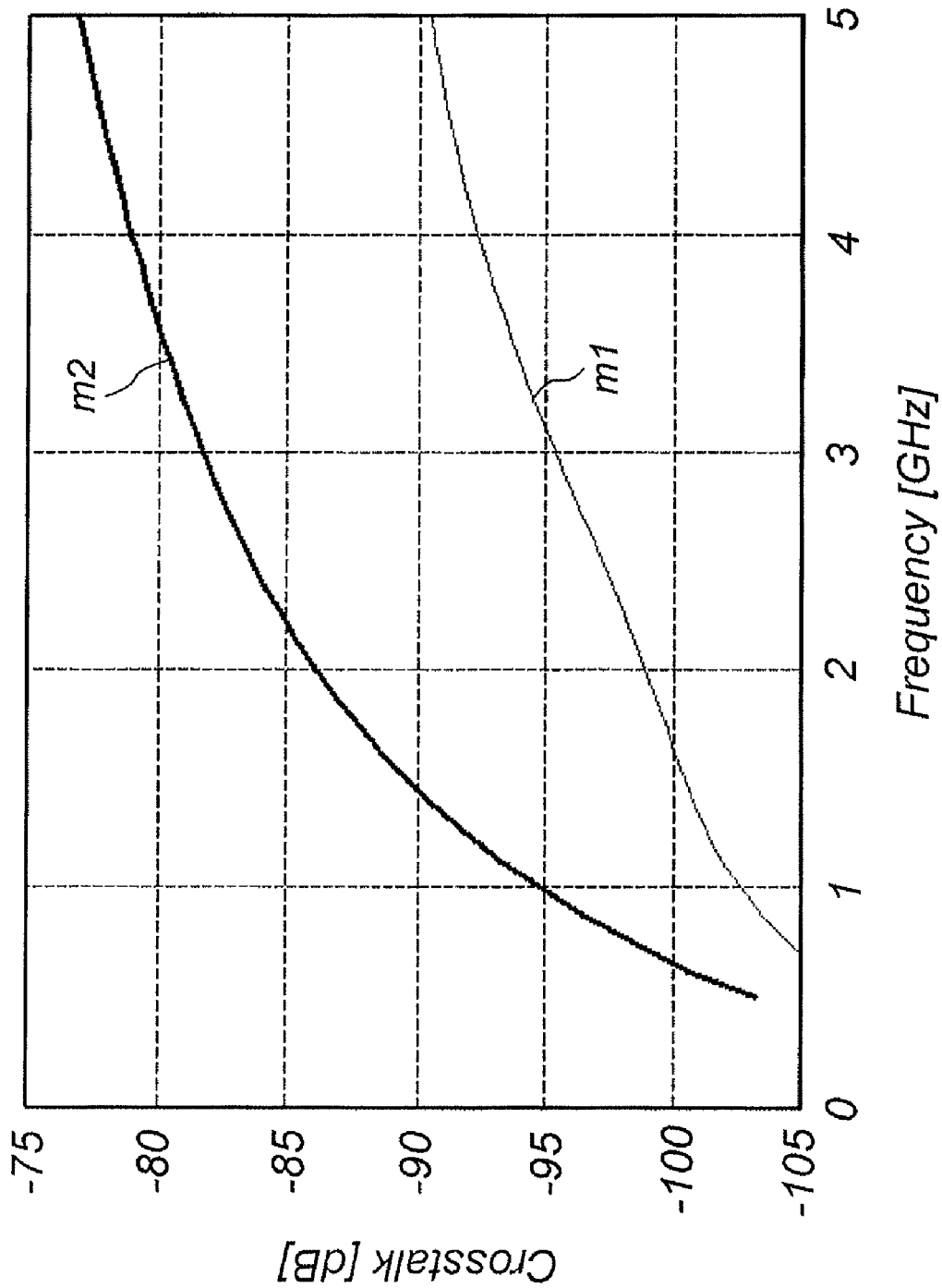

OPTICAL MODULE IMPLEMENTING A LIGHT-RECEIVING DEVICE AND A LIGHT-TRANSMITTING DEVICE WITHIN A COMMON HOUSING

BACKGROUND OF THE INVENTION

1. File of the invention

The present invention relates to an optical module that implements a light-receiving device, typically a photodiode (PD), and a light-transmitting device, typically a laser diode (LD), within a common housing. In particular, the invention relates to an optical bi-directional module with a co-axial package.

2. Related Prior Arts

A bi-directional module, where the PD and the LD are implemented with a common package with the co-axial shape, has been well known in the field of the optical communication. Such a bi-directional module drives the LD with a relatively larger current, typically over several tens of milli-ampere; while, the PD converts a faint optical signal received thereby into a small photocurrent, typically several micro-amperes at most. Accordingly, the crosstalk may easily occur from the transmitter section including the LD to the receiver section including the PD.

Various techniques have been known in the field to reduce the crosstalk. A Japanese patent published as JP-2005-203553A has disclosed one of the techniques where the optical module electrically separates the ground for the LD and that for the PD by mounting the LD and the PD on respective and separate metal plates. Another Japanese patent published as JP 2006-041234A has disclosed an optical module in which the LD is mounted on the substrate, while, the PD is shielded by the ground plane formed in the back surface of the substrate. Still another Japanese patent published as JP 2006-253820A, whose counter United States patent application has been published as US20060210280A has disclosed an optical transceiver that installs the Tx unit, the Rx unit, and the timing adjustor in the single housing. The timing adjustor adjusts the timing of the Tx unit and the Rx unit so as not to coincide the rising or the falling of respective pulse signals.

The techniques disclosed in prior documents reduce the crosstalk by physical substances, namely, the plural ground plate, the shielding plate and the timing adjustor circuit; accordingly, the module is necessary to secure a space for such physical substances and specific components. Thus, the prior techniques are hard to make the optical module compact in physical dimensions thereof.

SUMMARY OF THE INVENTION

The present invention is to solve the subjects appeared in the prior documents and to provide an optical module with a compact size and a simplified arrangement that results in the low cost module. An aspect of the present invention relates to a bi-directional module that is able to communicate with a single fiber. The bi-directional module of the invention comprises an LD that emits light with a first wavelength to the optical fiber by receiving driving signals complementary to each other; accordingly, the LD is driven in the differential mode. The bi-directional module further comprises a PD that generates a photocurrent by receiving light with the second wavelength from the fiber, a wavelength selective filter configured to pass the light with the second wavelength provided from the optical fiber to the PD and to reflect the light with the first wavelength emitted from the LD to the optical fiber. These LD, PD and filter are installed on a stem of a single package. The bi-directional further comprises at least two lead pins configured to provide the driving signals to the LD and two interconnections configured to carry the complementary signals from two lead pins to the LD. A feature of the bi-directional module according to the present invention is that the PD is mounted in a position on the stem where an electrical potential thereat is a midpoint potential of the complementary signals.

In the bi-directional module of the present invention, two interconnections and two lead pins may have parasitic capacitances viewed from the LD with respect to the stem. In such an arrangement, the electrical potential of the stem becomes the midpoint potential of the complementary signals, and this midpoint potential may be kept substantially constant; accordingly, the photocurrent generated by the PD may be escaped from the noise caused by the driving currents for the LD. Two interconnections connecting the lead pins with the LD may be formed on a LD sub-mount, and areas of these interconnections may be substantially equal to each other to equalize the parasitic capacitances viewed from the LD.

The PD may be mounted on a position closer to one of the interconnections whose edge facing the PD is shorter than an edge of the other interconnection facing the PD, that is, the position where the PD is mounted is along a line whose potential becomes a midpoint potential of the complementary signals.

The interconnections with bonding wires each connecting the lead pin with the interconnection may be twisted at least once between the lead pins and the LD. Because the EMI noise due to the magnetic field caused by the driving current carried on the interconnections and the bonding wires depends on the area surrounded by the interconnections with the bonding wires, and the direction of the magnetic field obeys the right-hand rule. Twisted interconnections with the bonding wires may narrow the areas surrounded thereby and may diffuse the direction of the magnetic field. Therefore, the photocurrent generated by the PD may be further escaped from the influence of the driving currents.

BRIEF DESCRIPTION OF DRAWINGS

FIG. 11 compares the crosstalk obtained in the optical module according to the fifth embodiment of the present invention shown in FIG. 10 with an optical module providing conventional interconnections on the LD sub-mount.

DESCRIPTION OF PREFERRED EMBODIMENTS

Next, preferred embodiments according to the present invention will be described as referring to accompanying drawings. In the description of the drawings, the same numerals or the symbols will refer to the same elements without overlapping explanations.

First Embodiment

Figure 1:
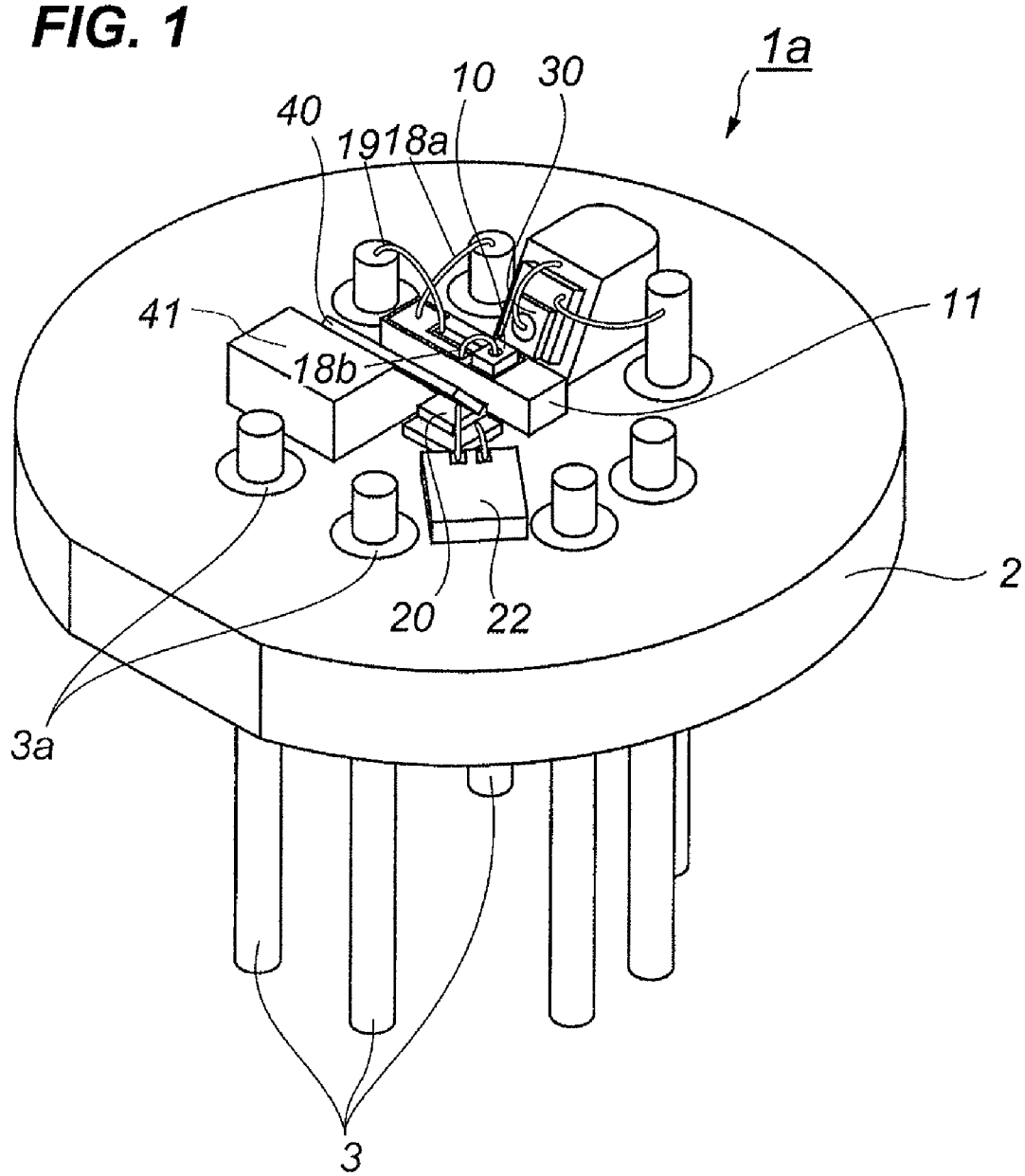
FIG. 1 is a perspective view of components assembled on a stem according to the first embodiment of the present invention.
Figure 2:
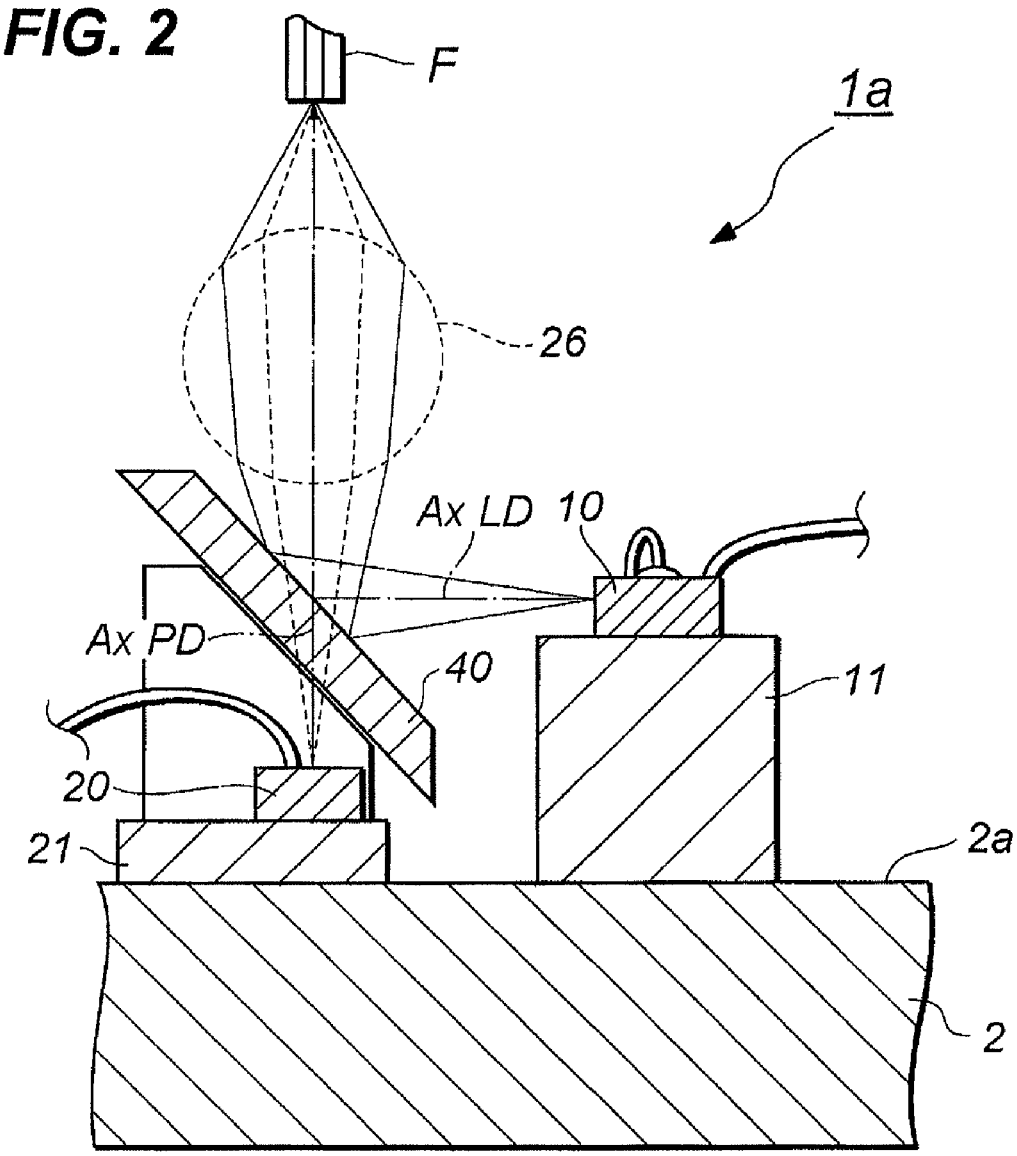
FIG. 2 schematically illustrates an optical coupling mechanism between semiconductor devices and an optical fiber F according to the present invention.
Figure 3:
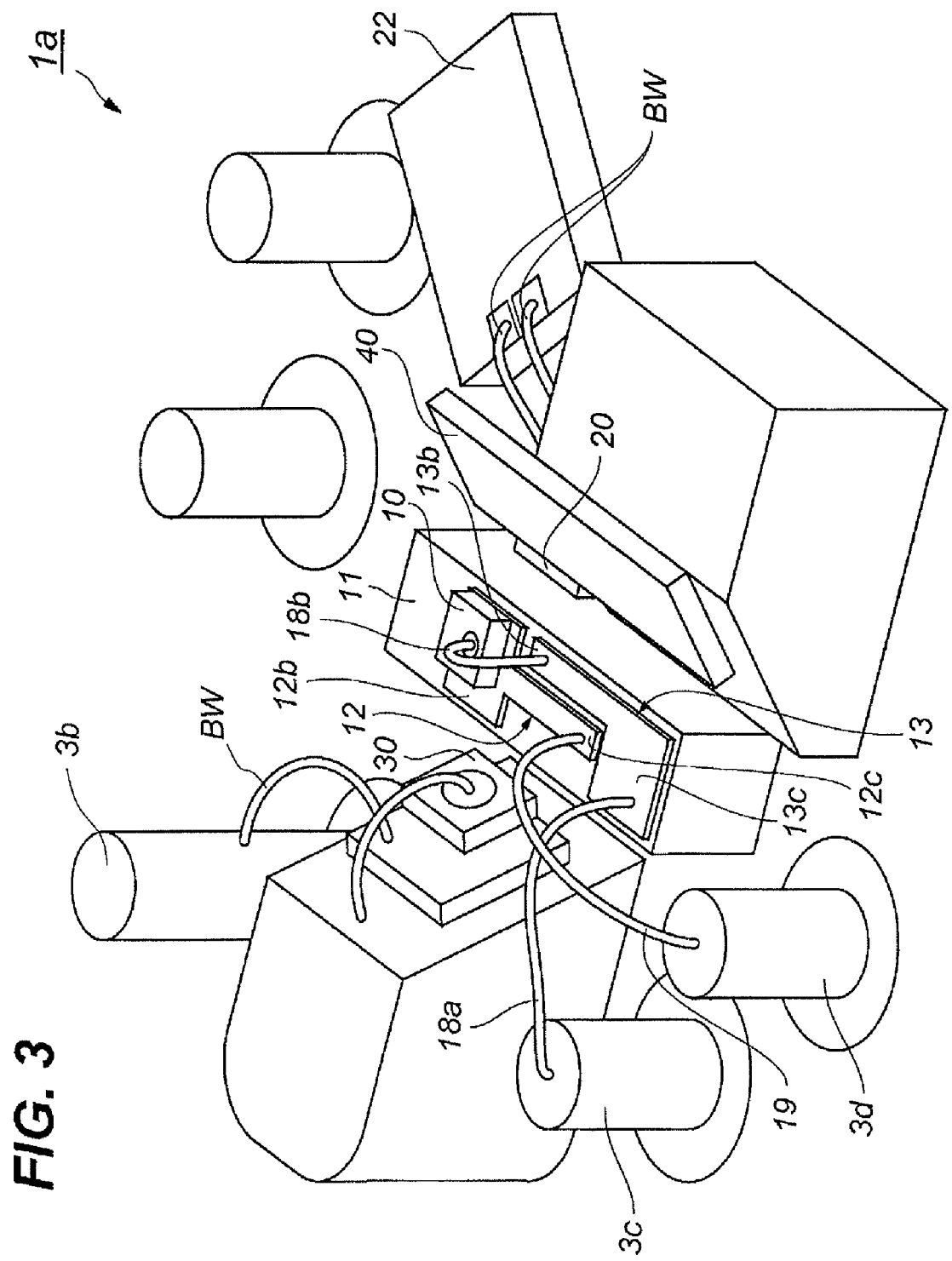
FIG. 3 shows a primary portion on the stem of the optical module according to the first embodiment of the present invention.
Figure 4:
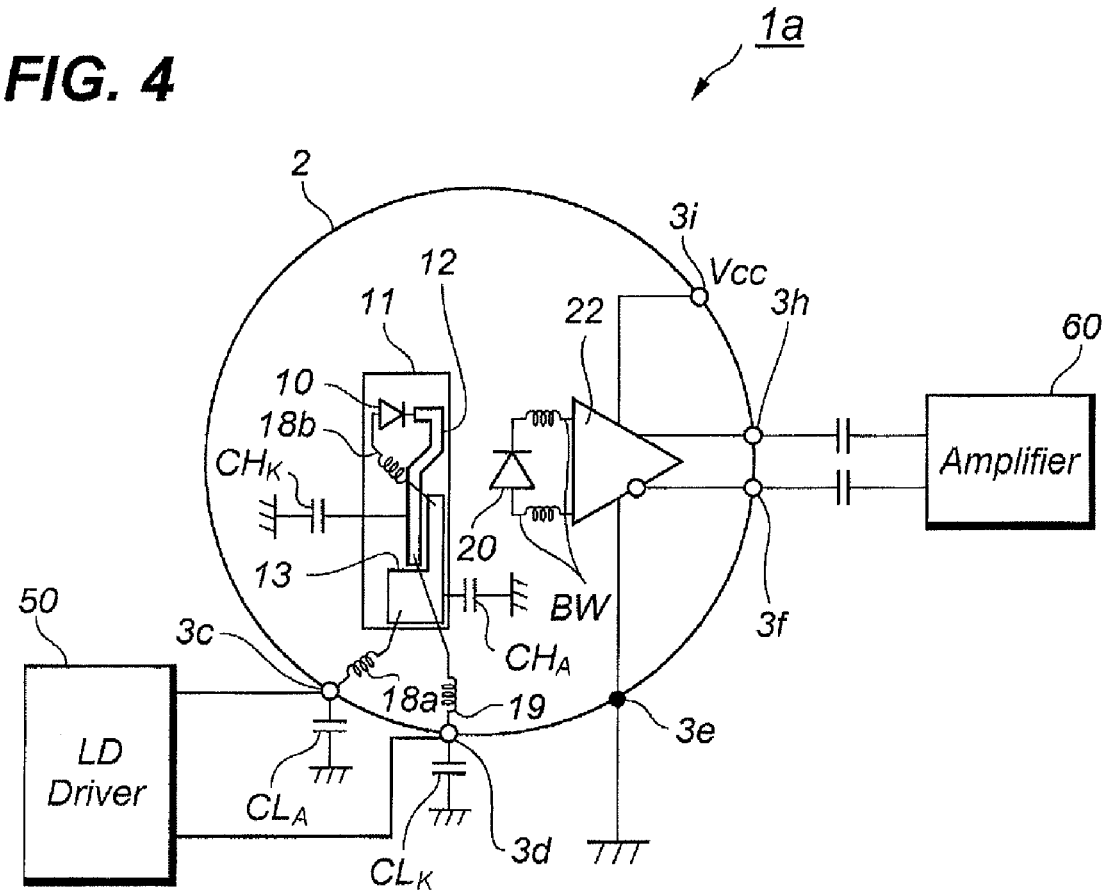
FIG. 4 schematically shows a circuit diagram of the optical module according to the first embodiment of the invention.

FIG. 1 illustrates a bi-directional optical module according to the first embodiment of the present invention. FIG. 2 schematically illustrates the optical coupling mechanism between the single optical fiber and two optical devices, one of which is a semiconductor laser diode (hereafter denoted as LD), and the other of which is a semiconductor photodiode (hereafter denoted as PD). FIG. 3 magnifies the interconnections provided on the LD sub-mount 11 shown in FIG. 1. FIG. 4 shows a circuit diagram of the bi-directional module 1a.

Referring to FIG. 1, the bi-directional optical module 1a, which is applicable to the bi-directional communication system whose transmission speed exceeds 1 GHz, includes a disk shaped stem 2 made of metal and a cap (not illustrated in figures) with a lens 26 or a window made of transparent material for the light to be transmitted. The cap is attached to the stem 2 to form a cavity where the semiconductor devices, 10, 20 and 30, are hermetically installed therein. The primary surface 2a of the stem 2 provides a mounting space, a diameter of which is about 2.8 mm from the center of the stem, and mounts the PD 20, a wavelength division selective filter 40, a PD sub-mount 21, the LD 10, a LD sub-mount 11, a pre-amplifier 22, and a monitor PD (hereafter denoted as MPD) 30 thereon.

A plurality of lead pins 3 extends from the stem 2. These lead pins 3 pass the body of the stem 2 so as to surround the mounting space. Because the leas pins 3 are supported by the stem 2 through, for instance seal glass 3a, the lead pins 3 may be electrically isolated from the metal stem 2. Thus, the lead pins 3 are able to provide signals and to supply the electrical power to the devices, 10, 20 and 30, mounted on the stem 2. The lead pins 3 are connected to the semiconductor devices through bonding wires with a diameter of about 25 μm and the interconnections on the sub-mounts, 11 and 21. Specifically, referring to FIG. 4, the lead pin 3i supplies the power Vcc to the pre-amplifier 22, while, the lead pin 3e provides the ground for the pre-amplifier 22. The lead pins, 3c and 3d, are connected to the LD-driver 50 in the outside of the module 1a, while, the lead pins, 3f and 3h, output the signals to the external amplifier 60.

The LD 10 emits light with the first wavelength to be transmitted in the fiber F by receiving driving signals complementary to each other in the cathode and the anode electrodes thereof. The light emitted from the LD 10 is concentrated on the end surface of the optical fiber F by the lens 26. The LD 10, in the anode and the cathode electrodes thereof, is coupled with the external driver 50 through the lead pins, 3c and 3d, the bonding wires 18a, 18b, and 19, and the interconnections, 12 and 13, on the LD sub-mount 11. Thus, the LD 10 is driven in the differential mode. The MPD 30, which is assembled in the rear of the LD 10 to monitor the back facet light emitted from the LD 10, is coupled with an external circuit for the automatic power control (APC) of the LD 10 through the other lead pin 3b and the bonding wire BW. The APC circuit adjusts, based on the monitored signal output from the MPD 30, the driving signals output from the LD driver 50 so as to keep the average power and the extinction ratio of the optical output from the LD 10 constant.

The LD sub-mount 11, having a substantially rectangular shape, is placed between the MPD 30 and the WDM filter 40. On the top surface of the LD sub-mount 11 is formed with the first interconnection 13 and the second interconnection 12 so as to extend along the longitudinal direction of the sub-mount 11. In other words, the first and second interconnections, 13 and 12, run in parallel on the LD sub-mount 11. The second interconnection 12 provides a die-pad for the LD 10. That is, the LD 10 is mounted on the end 12b of the second interconnection 12. In this embodiment shown in FIGS. 1 to 4, the LD 10 has a configuration of the edge-emitting type formed on the n-type semiconductor substrate, then, the bottom surface of the LD 10 becomes the cathode electrode, while, the top surface thereof becomes the anode electrode. When the LD 10 is formed on the p-type semiconductor substrate, the bottom surface provides the anode, while, the top surface thereof provides the cathode and this cathode electrode is electrically connected with the second interconnection 12.

One end 13b of the first interconnection 13 is coupled with the anode of the LD 10 by the bonding wire 18b, while, the other end 13c of the first interconnection 13 is coupled with the lead pin 3c with the other bonding wire 18a. One end 12c of the second interconnection 12 is coupled with the lead pin 3d by the bonding wire 19. Thus, the LD 10 may be driven by the driving signals complementary to each other that is provided from the external LD-driver 50 through the lead pins, 3c and 3d, the bonding wires, 18 and 19, and the interconnections, 12 and 13. The amplitudes of the driving signals are, in the current thereof, at least some thirty or forty milli-ampere in the peak-to-peak level. In FIG. 4, the bonding wires, 18a, 18b, 19 and BW, are denoted as respective inductors.

In the present embodiment particularly shown in FIG. 3, the end 13c of the first interconnection 13 bends toward the end 12c of the first interconnection so as to shield the end 12c and expands along the longitudinal direction of the LD sub-mount 11. That is, the end 13c of the first interconnection provides an expanded area where longitudinal and lateral widths are magnified. Thus, the first interconnection 13 is configured in the L-shape.

The PD 20 receives an optical signal provided from the optical fiber F and converts this optical signal into a current signal, which is generally called as the photocurrent. The magnitude of this photocurrent is some micro-ampere at most. The PD 20 is coupled with the pre-amplifier 22 through the bonding wires BW as illustrated in FIG. 3. The PD is mounted on the primary surface 2a of the stem 2 through the PD sub-mount 21 with a substantially rectangular shape. The bonding wire BW connects the top electrode of the PD 20 with the pre-amplifier 22; while, the other bonding wire and the interconnection on the PD sub-mount 21 connect the bottom electrode of the PD 20 with the pre-amplifier 22. Because the PD sub-mount 21 operates as a heat sink for the PD 20, it is necessary to be made of material with good thermal conductivity such as aluminum nitride. The PD sub-mount 21 is also necessary to be electrically isolated from the stem 2.

In the bi-direction optical module 1a, the filter 40 selectively reflects light with the first wavelength emitted from the LD 10 to the optical fiber F, while, selectively transmits light with the second wavelength different from the first wavelength provided from the fiber F to the PD 20.

The pre-amplifier 22 converts the photocurrent provided from the PD 20 into a voltage signal and amplifies this voltage signal to output the amplified signal to the external amplifier 60 through the lead pins, 3f and 3h. The pre-amplifier 22 is provided with the electrical power Vcc thorough the lead pin 3i and is grounded through the other lead pin 3e. The outputs of the pre-amplifier 22 are connected with the external amplifier in the AC-coupled mode.

Next, the operation of the bi-directional module 1a, in particular, the operation when the external driver 50 provides the driving signals to the module 1a, will be described.

Assuming that the inner diameter of the holes through which the lead pins 3 pass is 0.8 mm; the diameter of lead pins 3 is 0.3 mm; the thickness of the stem is 1.2 mm; and the gap between the lead pins and the stem 2 is filled with seal glass 3a with dielectric constant of 6.5, these are quite popular and average values, then the parasitic capacitance, $CL_A$ and $CL_K$, of the lead pins, 3c and 3d, to the stem 2 become 0.25 pF. Moreover, assuming that the thickness of LD sub-mount 11 is 0.55 mm and the material thereof is aluminum nitride whose dielectric constant $\in$ is about 9.0, then, the parasitic capacitance, $CH_A$ and $CH_K$, of the first and second interconnections, 13 and 12, to the stem become 0.022 pF and 0.030 pF, respectively, which depend on the areas interconnections.

Accordingly, the parasitic capacitance $C_A$ viewed from the anode of the LD 10 to the stem 2 and that $C_K$ viewed from the cathode thereof become:

$$C_A = CL_A + CH_A = 0.272 \text{ (pF)},$$

$$C_K = CL_K + CH_K = 0.280 \text{ (pF)}.$$

Thus, two parasitic capacitances become comparable. In the bi-directional optical module 1a shown in FIG. 4, because the LD sub-mount 11 provides the expanded end 13c in the first interconnection 13, two parasitic capacitances, $C_A$ and $C_K$, become comparable. While, the conventional bi-directional module having an arrangement substantially same with those shown in FIG. 4 but the pattern of the interconnection on the sub-mount, the area of first interconnection narrows, while, that of the second interconnection expands to mount the LD 10. In such an arrangement, the parasitic capacitances, $CH_A$ and $CH_K$, of the interconnections become 0.017 pF and 0.035 pF, respectively, and the capacitances, $C_A$ and $C_K$, viewed from respective electrodes of the LD 10 become:

$$C_A = CL_A + CH_A = 0.267 \text{ (pF)},$$

$$C_K = CL_K + CH_K = 0.285 \text{ (pF)}$$

The difference in the pattern of the first interconnection 13 and that of the second interconnection 12 on the LD sub-mount 11, in particular, the areas thereof, results in the difference of the parasitic capacitances, $C_A$ and $C_K$. On the other hand, the bi-direction module 1a according to the first embodiment of the present invention provides the expanded end 13c in the first interconnection 13, which consequently widens the area thereof, and two parasitic capacitance, $C_A$ and $C_K$, viewed from respective electrodes of the LD 10 become comparative.

The arrangement of the interconnections, 12 and 13, described above may bring an advantage below. That is, even when the driving signals complementary to each other propagate on the interconnections, 12 and 13, and portions of the signals leak in the stem 2, the potential may be held in the midpoint between two differential signals, in other words, the potential may be held in the midpoint potential between the anode and cathode levels, which may stabilize the ground potential. As a result, the common mode noise appeared in the photocurrent generated by the PD 20 may be suppressed. The common mode noise usually depends on the fluctuation of the ground potential.

As already explained, the driving current for the LD 10 is far greater, three figures or more, than the photocurrent generated by the PD 20, and the mounting area on the primary surface 2a of the stem 2a is around 2.8 mm at most in the diameter thereof; accordingly, the driving signals to drive the LD 10 that has a frequency of 10 GHz or higher influence the EMI noise in the whole mounting area. The conventional bi-directional module lacks interconnections on the LD sub-mount whose parasitic capacitances are substantially comparable; accordingly, the faint photocurrent generated by the PD 20 is strongly affected by the common mode noise primarily due to the driving current for the LD, which is called as the crosstalk noise. This crosstalk noise becomes conspicuous as the operation speed of the module increases because the characteristic length becomes shorter in the high frequencies and is comparable to the dimensions of the mounting area.

In the bi-directional module 1a according to the embodiment of the invention, because the interconnections on the LD sub-mount 11 have the parasitic capacitance substantially comparable with each other, the bi-directional module 1a may suppress the crosstalk noise without any specific shielding members and particular circuits. The expanded portion of the interconnection to make the parasitic capacitance comparable may be set in the halfway thereof. However, because such an arrangement of the interconnection degrades the characteristic impedance of the interconnection, the expanded portion is preferably arranged in the end of the interconnection. In the embodiment shown in FIGS. 1 to 4, since the end 12b of the second interconnection 12 is expanded to mount the LD 10 thereon, the first interconnection 13 provides the expanded area in the end 13c thereof.

Second Embodiment

Figure 5:
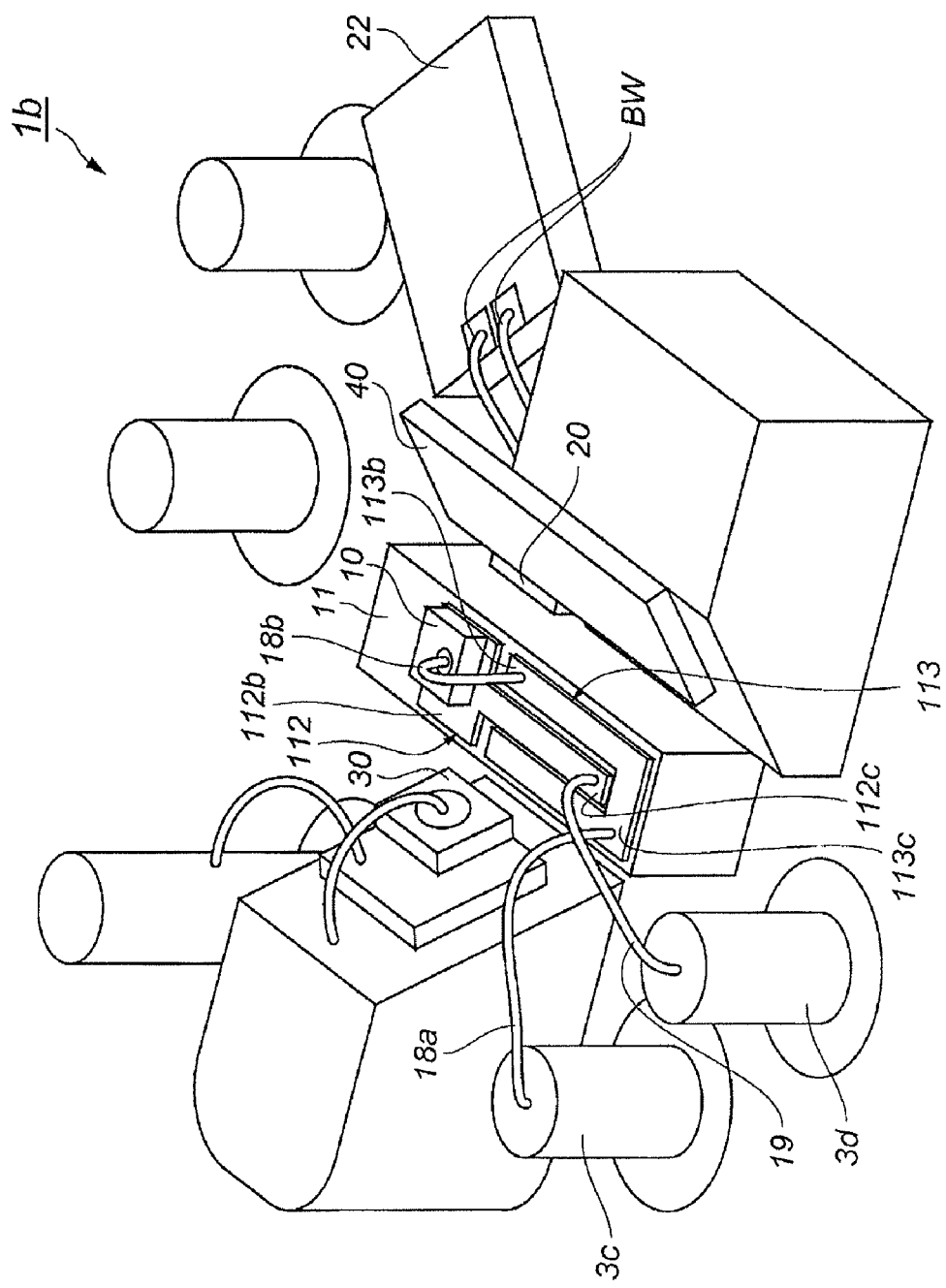
FIG. 5 shows a primary portion on the stem of the optical module according to the second embodiment of the present invention.

FIG. 5 magnifies a primary portion of a bi-directional module 1b according to the second embodiment of the invention; in particular, FIG. 5 illustrates the interconnections, 112 and 113, on the LD sub-mount 11. This bi-directional module 1b provides the first and second interconnections, 113 and 112, respectively, instead of the interconnections, 13 and 12, in the first embodiment 1a shown in FIGS. 1 to 4.

The first interconnection 113 is arranged so as to surround the second interconnection 112. That is, the first interconnection 113 forms in the U-shape, while, the second interconnection 112 is formed in the T-shape whose longitudinal bar is surrounded by the U-shape. The bonding wire 18b connects the top electrode, the anode, of the LD 10 with the end 113b of the first interconnection 13, while, the other bonding wire 18a connects the lead pin 3c with the other end 13c, the surrounding portion, of the first interconnection 113. In this arrangement, the area of the first interconnection 113 and that of the second interconnection 112 are substantially comparable to each other. The parasitic capacitances, $CH_A$ and $CH_K$, may be calculated to be 0.031 pF and 0.034 pF, respectively, based on the assumed parameters already described, then, the parasitic capacitances viewed from the electrodes of the LD 10 become:

$$C_A = CL_A + CH_A = 0.281 \text{ (pF)},$$

$$C_K = CL_K + CH_K = 0.284 \text{ (pF)}.$$

Thus, even if the interconnections, 112 and 113, on the LD sub-mount 11 electrically couple with the stem 2 through the parasitic capacitances, $CH_A$ and $CH_K$, which means that a portion of the driving signals leaks in the stem 2, the potential of the stem 2 does not fluctuate because the potential of the stem 2 may be held in the midpoint potential between the anode and the cathode of the LD 10. The stability of the ground potential may suppress the crosstalk noise of the bi-directional module 1b without any specific shields and particular circuit.

Third Embodiment

Figure 6:
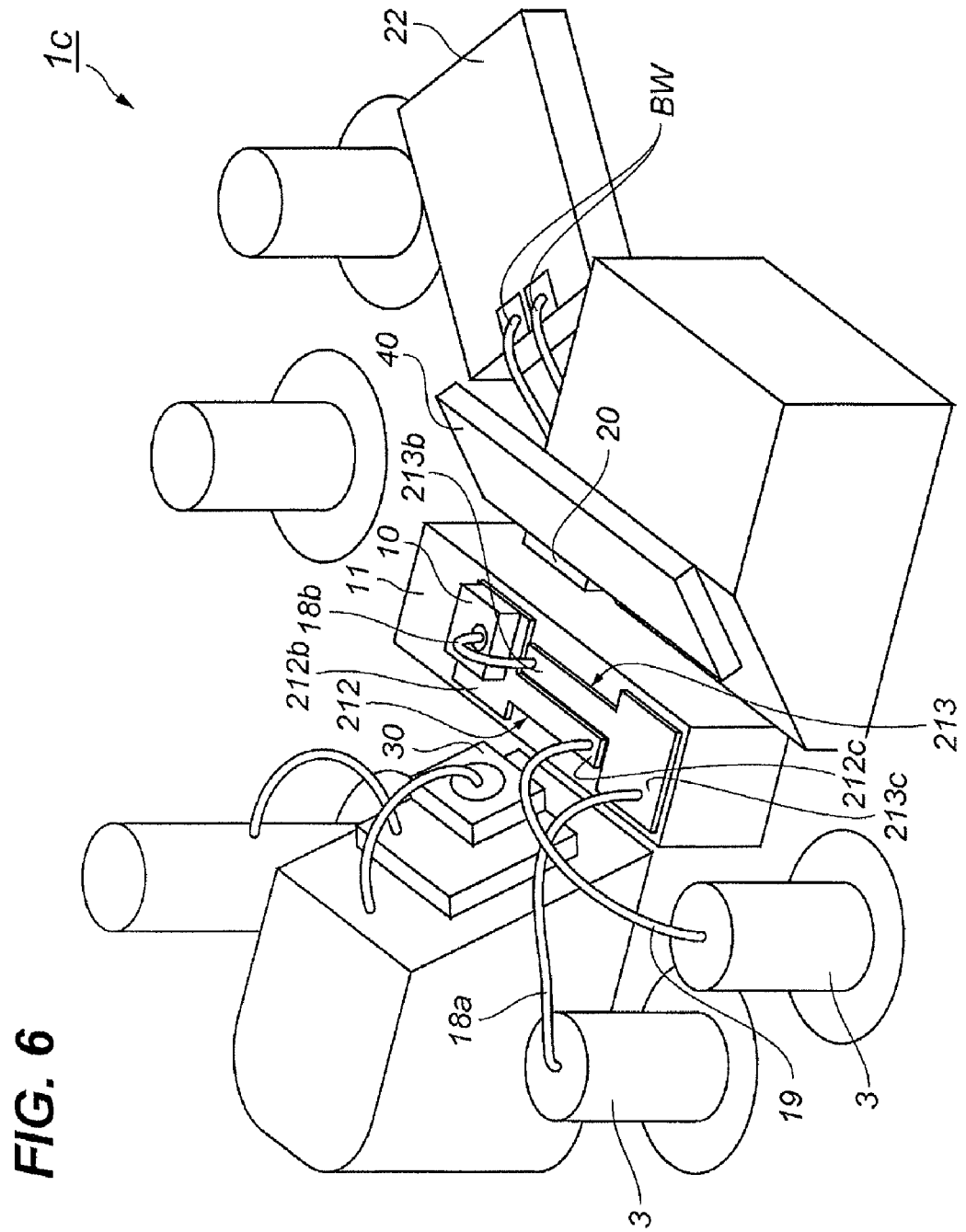
FIG. 6 shows a primary portion on the stem of the optical module according to the third embodiment of the present invention.

FIG. 6 illustrates a primary portion, in particular, the interconnections, 212 and 213, provided on the LD sub-mount 11, of the bi-directional module 1c according to the third embodiment of the invention The bi-directional module 1c provides the interconnections, 212 and 213, on the LD sub-mount 11 in place of the interconnections, 12 and 13, in the first embodiment shown in FIGS. 1 to 4. That is, two interconnections, 212 and 213, are formed in the T-shape whose longitudinal bar is offset, and are placed in complementary to each other.

The bonding wire 18b connects the end 213b of the first interconnection 213 with the top electrode of the LD 10, while, the bonding wire 18b connects the lead pin 3c with the other end 213c of the first interconnection 213. The end 213c of the first interconnection 213 has the T-shape with an expanded area.

In this arrangement of the interconnections, 212 and 213, the area of both interconnections become substantially comparable to each other, and the parasitic capacitances thereof are calculated to be $CH_A$=0.028 pF and $CH_K$=0.031 pF, respectively, based on the assumed parameters already described. Then, the parasitic viewed from the electrodes of the LD 10 to the stem 2 become:

$$C_A = CL_A + CH_A = 0.278 \text{ (pF)},$$

$$C_K = CL_K + CH_K = 0.281 \text{ (pF)}$$

That is, the parasitic capacitances, $C_A$ and $C_K$, become comparable. Thus, even if the interconnections, 212 and 213, on the LD sub-mount electrically couple with the stem 2 through the parasitic capacitances, $CH_A$ and $CH_K$, which means that a portion of the driving signals leaks to the stem 2, the potential of the stem 2 does not fluctuate because the electrical potential of the stem 2 may be held in the midpoint potential between the anode and the cathode of the LD 10. The stability of the ground potential may suppress the crosstalk noise of the bi-directional module 1b without any specific shields and particular circuit.

Figure 7:
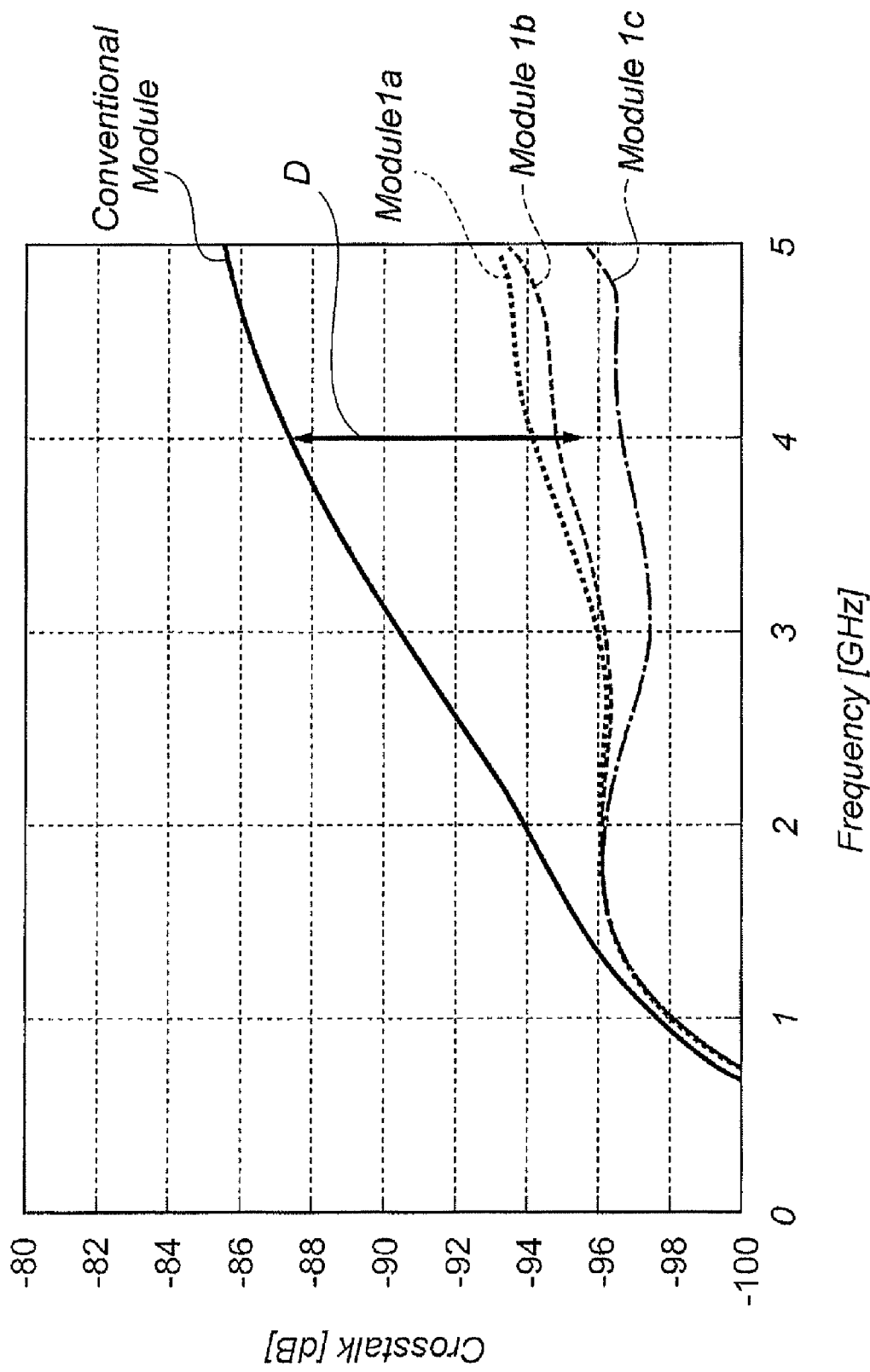
FIG. 7 is a graph comparing the reduction of the crosstalk in the optical modules shown in FIGS. 4 to 6 with a convention module.

FIG. 7 shows the crosstalk noise of the bi-directional modules, 1a to 1c, according to the embodiments of the present invention and that of the conventional module. The conventional module shows the crosstalk noise monotonically increasing as the frequency increases and reaches about −87 dB at a frequency of 4 GHz. While, the crosstalk of the present modules, 1a to 1c, are less than −94 dB in frequencies below 4 GHz, which shows an improvement at least about 8 dB compared to the conventional one as shown by the arrow D in FIG. 7.

Fourth Embodiment

Figure 8:
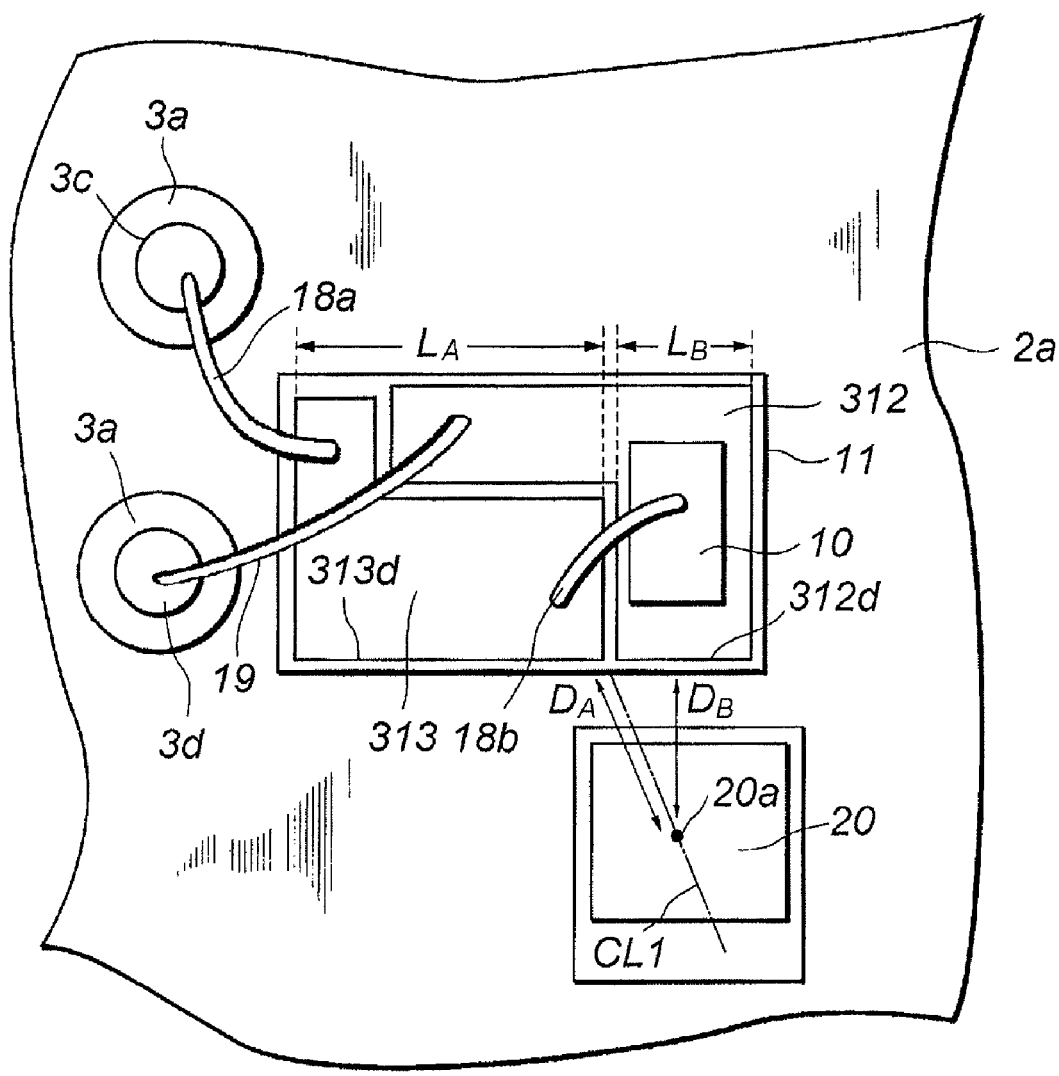
FIG. 8 illustrates interconnections on the LD sub-mount that carries the driving current for the LD according to the fourth embodiment of the present invention.
Figure 9:
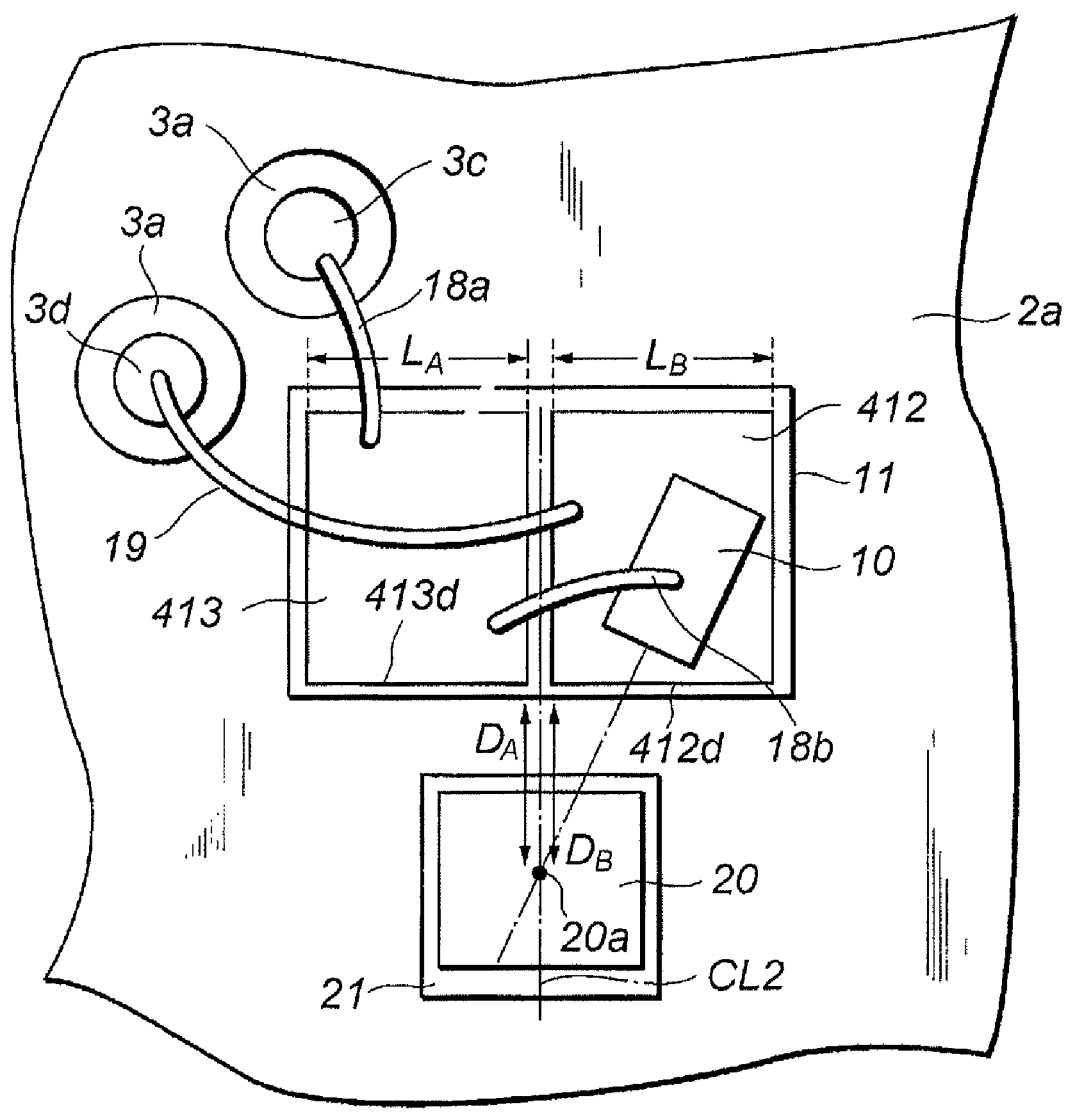
FIG. 9 illustrates another interconnections on the LD modified from those shown in FIG. 8.

Not only the arrangement of the interconnections on the LD sub-mount 11 but the position of the PD 20 becomes effective to suppress the crosstalk. FIGS. 8 and 9 describe the mechanism to suppress the crosstalk by the position of the PD 20. As illustrated in FIG. 2, the LD 10 and the PD 20 are aligned in the directions and the levels thereof measured from the primary surface 2a of the stem 2 such that the axis AxLD for the light emitted from the LD 10 and the axis AxPD for the light received by the PD 20 intersect at the filter 40. Moreover, the PD 20 is mounted on the primary surface 2a of the stem 2 such that the surface of the PD 20 is substantially in parallel with the axis AxLD of the LD 10. According to this arrangement between the LD 10 and the PD 20 and the wavelength selective function of the filter 40, the axis AxLD for the LD 10 and the axis AxPD for the PD 20 coincide with each other between the WDM filter 40 and the fiber F.

When the LD 10 is differentially driven by the signals complementary to each other; the midpoint potential between the complementary signals becomes anode whose potential may be held in stable. Therefore, even the interconnections formed on the LD sub-mount 11 have respective areas different from each other, which results in the different parasitic capacitance viewed from the electrodes of the LD 10 to the stem 2, the PD 20 may be escaped from the fluctuation of the ground potential by setting the position of the PD 20 in a point where the midpoint potential of the complementary signals is maintained.

FIG. 8 describes one example of the arrangement of the PD 20. In FIG. 8, the LD 10 is mounted on the primary surface 2a of the stem 2 by interposing with the LD sub-mount 11. On the LD sub-mount 11 is formed with two interconnections, 312 and 313, to connect the electrodes of the LD 10 with the lead pins, 3c and 3d. These interconnections, 312 and 313, have an L-shape so as to divide the top surface of the LD sub-mount 11 into two areas complementarily, and have respective linear edges facing the PD 20. The first interconnection 313 connects the top electrode of the LD 10 with the lead pin 3c by two bonding wires, 18a and 18b, while, the second interconnection 313 connects the bottom electrode of the LD 10 with the other lead pin 3d by the bonding wire 19.

The PD 20 is mounted adjacent to the LD 10 on the primary surface 2a of the stem 2 interposing the PD sub-mount 21. Specifically, the PD 20 is mounted just in front of the LD 10. Moreover, the edges, 312d and 313d, of respective interconnections, 312 and 313, have different widths, $L_A$ and $L_B$, and are formed such that the former width becomes wider than the latter, $L_A > L_B$. Because the PD 20 is just in front of the LD 10, the distance $D_B$ from the PD 20 to the second interconnection 312 is shorter than that $D_A$ to the first interconnection 313, $D_A > D_B$. Describing further specifically, the PD 20 is mounted such that the center 20a of the PD 20 is on the line CL1 providing the midpoint potential between two interconnections, 312 and 313. The line CL1 is inclined toward the direction where the width of the edge of the interconnection is shorter. Thus, when the edges, 312d and 313d, of the interconnections, 312 and 311, have widths of $L_A < L_B$, the PD 20 may be set on a position where the distance from the center 20a thereof to respective edges, 312d and 313d, of the interconnection becomes $D_A < D_B$. In such a case, the line CL1 inclines toward the first interconnection 313.

In such a configuration of the PD 20 being mounted on the primary surface 2a of the stem 2, because the PD 20 is placed on the line CL1 providing the midpoint potential with respect two interconnections, 312 and 313, that carries the driving signals complementary to each other, the PD 20 may be moderated from the EMI noise caused by the large driving currents for the LD 10. Moreover, the stem 2 is unnecessary to provide specific members to release the PD 20 from the EMI noise caused by the LD 10, which makes it possible for the optical module to be small-sized.

Moreover, the PD 20 is mounted on the optical axis, AxLD, of the LD 10; accordingly, the lens 26 and the WDM filter 40 may couple the LD 10 and the PD 20 each mounted on the stem 2 with the optical fiber F, which may simplify the design of the optical coupling system.

FIG. 9 explains another arrangement of the LD 10 and the PD 20 according to the present embodiment of the invention. In this arrangement, the LD sub-mount 11 provides the interconnections, 412 and 413, where they equally divide the top surface of the sub-mount 11 to configure the edges, 412d and 413d, thereof to have the same widths, $L_A$ and $L_B$. The center 20a of the PD 20 is on the line CL2 providing the midpoint potential between two interconnections, 412 and 413, such that the distances, $D_A$ and $D_B$, to respective interconnections, 412 and 413, become equal to each other. In this arrangement, the LD 10 is so adjusted in its mounting direction that the optical axis of the LD 10, AxLD, is directed on the PD 20.

Fifth Embodiment

In the optical module thus described above, the bonding wires, 18a and 19, connecting the interconnections, 412 and 413, formed on the LD sub-mount 11 with respective lead pins, 3a and 3c, crosses in the air. Specifically, the module has a configuration that the first interconnection 13 with the bonding wire 18a and the second interconnection 12 with the other bonding wire 19 are twisted in a midway from the lead pin 3 to the LD 10. The magnetic field strength caused by the current is proportional to an area surrounded by the current paths and the direction of the magnetic filed is determined by the right-hand rule. Therefore, twisting the current paths to and from the LD 10 makes not only the area surrounded thereby small but the field strength sensed by the PD 20 small by compensating the field direction of the front half path by that of the rear half path.

FIG. 11 describes an advantage by twisting the current paths between the lead pins and the LD 10. FIG. 11 illustrates the frequency response of the crosstalk appeared in the PD 20. As mentioned earlier, the photocurrent generated in the PD 20 is usually several micro-ampere (μA) at most in the peak-to-peak definition, while, the driving current for the LD 10 reaches and sometimes exceeds several scores of milli-ampere, which is at least three figures greater than the photocurrent. The magnetic field caused by the current paths carrying the driving current for the LD 10 strongly influences the photocurrent.

The behavior m1 appeared in FIG. 11 corresponds to the crosstalk measured in the optical module according to the present invention, where the module provides the twisted current paths to the LD 10, while, the behavior m2 corresponds to the conventional module without twisted current paths. For instance, the crosstalk measured at a frequency of 2 GHz in the conventional module appears about −82 dB, while, the present module shows the crosstalk of about −94 dB which improves by 12 dB.

Figure 10:
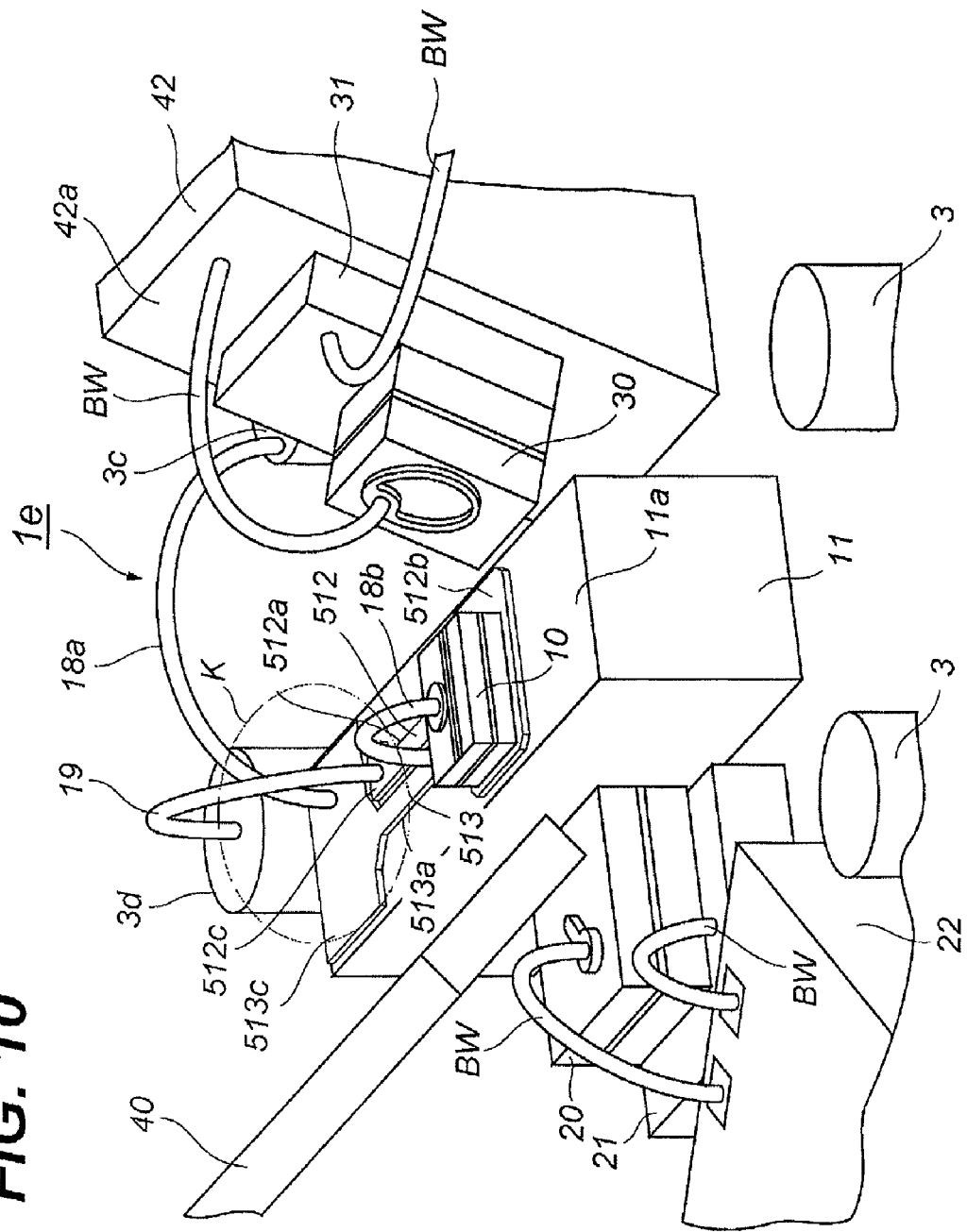
FIG. 10 shows a primary portion on the stem of the optical module according to the fifth embodiment of the present invention.

The optical module 1e illustrated in FIG. 10 has a current path of the bonding wire 18a with the first interconnection 513 on the LD sub-mount 11 and another current path of the bonding wire 19 with the second interconnection 512 on the LD sub-mount. These current paths are twisted in a region K circled in FIG. 10. Thus, the magnetic field caused by the current carried on these current paths rotates the direction thereof on the LD sub-mount 11. Moreover, twisted current paths may narrow the area surrounded thereby. Thus, the crosstalk of the optical modules according to the embodiments described above may be reduced. The optical modules according to the embodiments place the pre-amplifier 22 in a side opposite to the current paths on the LD sub-mount 11 with respect to the LD 10, which may also reduce the crosstalk due to the driving current for the LD 10.

While this invention has been described with reference to illustrative embodiments, the description is not intended to be construed in a limiting sense. Various modifications and combinations of the illustrative embodiments, as well as other embodiments of the invention, will be apparent to persons skilled in the art on reference to the description. It is therefore intended that the appended claims encompass any such modifications or embodiments.

What is claimed is:

1. A bi-directional optical module optically communicating with a single optical fiber, comprising:

a laser diode for emitting light with a first wavelength to said optical fiber by receiving driving signals complementary to each other, said laser diode being driven in a differential mode;

a photodiode for generating a photocurrent by receiving light with a second wavelength different from said first wavelength from said optical fiber;

a wavelength selective filter for passing said light with said second wavelength provided from said optical fiber to said photodiode and for reflecting said light with said first wavelength emitted from said laser diode to said optical fiber, said laser diode, said photodiode and said wavelength selective filter being installed on a stem of a package;

two lead pins for providing said driving signals to said laser diode;

two interconnections for carrying said complementary signals from said two lead pins to said laser diode, wherein said photodiode is mounted in a position on said stem where an electrical potential is a midpoint potential of said complementary signals.

2. The bi-directional optical module according to claim 1, wherein said two interconnections and said two lead pins have parasitic capacitances viewed from said laser diode with respect to said stem.

3. The bi-directional optical module according to claim 2, wherein one of said interconnection has a bonding pad in an end thereof to mount said laser diode thereon, and the other of said interconnection has an expanded area in an end thereof opposite to said bonding pad, wherein said two interconnections have substantially same area to each other.

4. The bi-directional optical module according to claim 3, wherein said two interconnections have an L-shape complimentary to each other, wherein said bonding pad and said expanded area make up a bottom line of said L-shape.

5. The bi-directional optical module according to claim 3, wherein said two interconnections have a T-shape complimentary to each other, wherein said bonding pad and said expanded area make up a top line of said T-shape and portions extended from said bonding pad and said expanded area oppositely make up a longitudinal line of said T-shape, and wherein said longitudinal lines of said interconnections are offset to each other.

6. The bi-directional optical module according to claim 3, wherein one of said interconnection has a T-shape and the other of said interconnections has a U-shape formed so as surround a longitudinal line of said T-shape.

7. The bi-directional optical module according to claim 2, further comprising a laser diode sub-mount, wherein said two interconnections are formed of said laser diode sub-mount.

8. The bi-directional optical module according to claim 1, where said photodiode is mounted closer to said one of interconnections whose edge facing said photodiode is shorter than an edge of another interconnection facing said photodiode.

9. The bi-directional optical module according to claim 8, wherein said laser is mounted on said stem such that an optical axis of said laser diode heads for said photodiode.

10. The bi-directional optical module according to claim 1, further comprising a pre-amplifier to convert said photo-current into an electrical signal and to amplify said electrical signal, wherein said pre-amplifier is mounted in a position on said stem opposite to said interconnections with respect to said laser diode.

11. The bi-directional optical module according to claim 1, further comprising two bonding wires each connecting said lead pins to said respective interconnections, wherein one of said interconnections with said one of bonding wires and another interconnection with another bonding wire are twisted at least once between said lead pins and said laser diode.

* * * * *